(12) United States Patent
Grider et al.

(10) Patent No.: US 6,699,763 B2
(45) Date of Patent: Mar. 2, 2004

(54) DISPOSABLE SPACER TECHNOLOGY FOR REDUCED COST CMOS PROCESSING

(75) Inventors: Douglas T. Grider, McKinney, TX (US); Terence Breedijk, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 25 days.

(21) Appl. No.: 10/389,017

(22) Filed: Mar. 13, 2003

(65) Prior Publication Data

US 2003/0176033 A1 Sep. 18, 2003

Related U.S. Application Data

(63) Continuation of application No. 09/339,444, filed on Jun. 24, 1999.
(60) Provisional application No. 60/092,910, filed on Jul. 15, 1998.

(51) Int. Cl.[7] ............... H01L 21/336; H01L 21/311; H01L 21/302; H01L 21/461
(52) U.S. Cl. .............. 438/303; 438/305; 438/696; 438/752
(58) Field of Search ................. 438/305, 303, 438/696, 752, 199, 231, 151, 238, 234, 596

(56) References Cited

U.S. PATENT DOCUMENTS

| | | | |
|---|---|---|---|
| 5,200,352 A | | 4/1993 | Pfiester |
| 5,324,683 A | | 6/1994 | Fitch et al. |
| 5,506,161 A | | 4/1996 | Orlowski et al. |
| 5,543,339 A | | 8/1996 | Roht et al. |
| 6,022,782 A | | 2/2000 | Smith et al. |
| 6,087,239 A | * | 7/2000 | Juengling ............ 438/305 |
| 6,127,234 A | * | 10/2000 | Gardner et al. ....... 438/303 |
| 6,159,815 A | | 12/2000 | Lustig et al. |
| 6,221,709 B1 | | 4/2001 | Sagarwala et al. |
| 6,261,964 B1 | * | 7/2001 | Wu et al. ............ 438/705 |
| 6,300,207 B1 | * | 10/2001 | Ju ..................... 438/305 |

* cited by examiner

Primary Examiner—John Niebling
Assistant Examiner—Walter L. Lindsay, Jr.
(74) Attorney, Agent, or Firm—Jacqueline J. Garner; W. James Brady, III; Frederick J. Telecky, Jr.

(57) ABSTRACT

A method of fabricating a CMOS transistor using a silicon germanium disposable spacer (114) for the source/drain implant. After gate etch, silicon germanium disposable spacers (114) are formed. A NMOS resist pattern (116) is formed exposing the NMOS regions (120) and the n-type source/drain implant is performed. The disposable spacers (114) in the NMOS regions are removed and, with the NMOS resist mask (116) still in place, the LDD/MDD implant is performed. The process may then be repeated for the PMOS regions (122).

6 Claims, 3 Drawing Sheets

DISPOSABLE SPACER TECHNOLOGY FOR REDUCED COST CMOS PROCESSING

This is a continuation application of Ser. No. 09/339,444 filed Jun. 24, 1999 which is a non-provisional application of provisional application No. 60/092,910 filed Jul. 15, 1998.

FIELD OF THE INVENTION

The invention is generally related to the field of CMOS transistor fabrication and more specifically to forming CMOS transistors using disposable spacers.

BACKGROUND OF THE INVENTION

To remain competitive in today's semiconductor market, companies are under constant pressure to reduce the manufacturing costs. One means of significantly reducing this cost is by eliminating mask levels. Each mask level incorporates a number of steps such as resist coating, exposure, development, alignment check and then several clean-up steps (resist ash, resist strip, megasonic clean). Each mask eliminated can result in considerable reduction in manufacturing cost and improve profit margin.

There are many masking levels in conventional CMOS transistor formation. After several masking levels for the formation of isolation regions and threshold adjust implants, the gate dielectric and polysilicon gate material are deposited. One or more masking levels may then be used to separately dope the NMOS and/or PMOS polysilicon regions. Then the polysilicon is patterned and etched using a gate pattern masking level. Then, there are MDD/LDD PMOS and NMOS masking levels for masking the p-type and n-type MDD/LDD implants from each other. Then, sidewall spacer are formed. This is followed by the NMOS source/drain implant using a mask to block implant from the PMOS regions and a PMOS source/drain implant using another mask to block the implant from the NMOS regions. Subsequent to the formation of the transistor are several masking levels for each layer of interconnect such as masking levels for contact/via etch and metal interconnect etches.

There has been some reduction in the number of mask levels needed. For example, the p-type source/drain and MDD/LDD implants have been optimized in some processes to eliminate the need for a separate p-type polysilicon implant and corresponding mask. However, there is a need to further minimize the number of masking levels in order to reduce manufacturing cost.

SUMMARY OF THE INVENTION

The invention is a method of fabricating a CMOS transistor using a silicon germanium disposable spacer for the source/drain implant. After gate etch, silicon germanium disposable spacers are formed. A NMOS resist pattern is formed exposing the NMOS regions and the n-type source/drain implant is performed. The disposable spacers in the NMOS regions are removed and, with the NMOS resist mask still in place, the LDD/MDD implant is performed. The process may then be repeated for the PMOS regions.

An advantage of the invention is the elimination of separate masks for the LDD/MDD and source/drain implants.

This and other advantages will be apparent to those of ordinary skill in the art having reference to the specification in conjunction with the drawings.

DETAILED DESCRIPTION OF THE EMBODIMENTS

The invention will now be described in conjunction with a process for forming CMOS transistors. It will be apparent to those of ordinary skill in the art that the benefits of the invention may also be applied to other processes such as other CMOS processes or BiCMOS processes where it is desirable to use disposable spacers and/or reduce mask steps in forming MOSFET transistors.

The invention utilizes silicon-germanium (SiGe) disposable spacers after gate etch for the source/drain implants. With the NMOS resist mask remaining in place, the disposable spacers for the NMOS regions are removed between the source/drain implant and the moderately (or lightly) doped (MDD/LDD) implant. The process is then repeated for the p-type regions. Thus, only one mask is used for the n-type implants and one mask is used for the p-type implants.

Figure 1A:
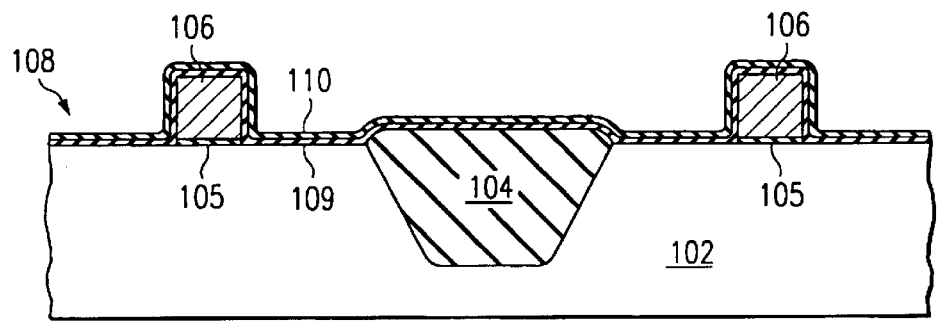
FIGS. 1A–1I are cross-sectional diagrams of a CMOS process according to the invention at various stages of fabrication.

The process of the invention will now be described with reference to FIGS. 1A–1I. The semiconductor wafer 102 is processed through the formation of isolation regions 104, gate dielectric 105, and gate electrodes 106 using methods known in the art. An etch stopping layer 108 is then formed over the structure, as shown in FIG. 1A. As an example, the etch stopping layer 108 may comprises a layer of oxide and/or a layer of nitride. In the preferred embodiment, a layer of oxide 109 with an overlying layer of nitride 110 is used. The layer of oxide 109 may be formed using what is known in the art as a poly smile oxidation. The thickness of etch stopping layer 108 may vary depending on the material used. However, for oxide a thickness on the order of 60 Å is sufficient.

Figure 1B:
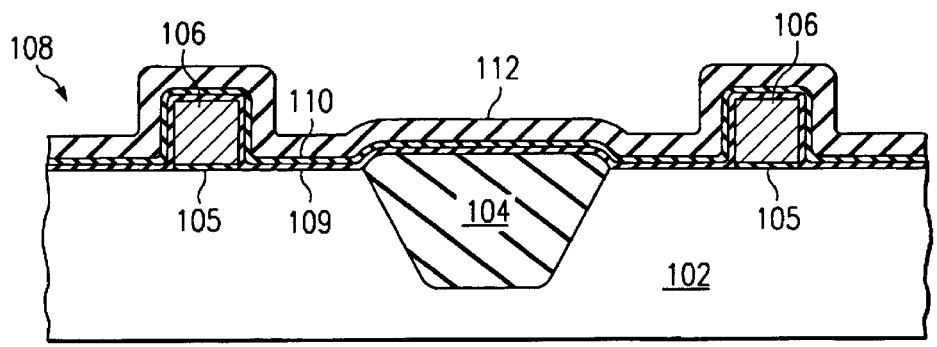

Referring to FIG. 1B, a layer comprising germanium 112 is deposited over the structure. Layer 112 preferably comprises SiGe but may alternatively comprise substantially pure germanium. SiGe has excellent selectivity to oxide and nitride (as may be used in etch stopping layer 108). SiGe has better selectivity than polysilicon. The thickness of layer 112 is determined by the desired spacing of the subsequent source/drain implant from the gate electrode 106 edge. Typically, a thickness in the range of 500–1000 Å is used. As the technology scales further this range may decrease.

Figure 1C:
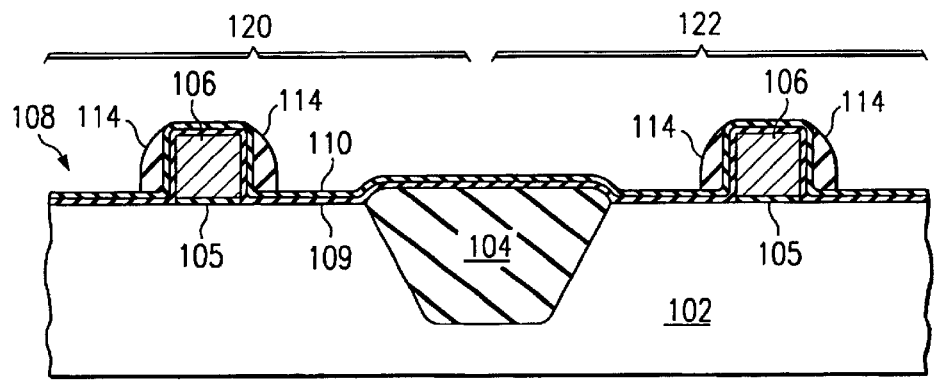

An anisotropic etch of SiGe layer 112 is then used to form disposable sidewall spacers 114, as shown in FIG. 1C. Disposable spacers 114 are formed on the sidewalls of gate electrode 106 (although they are actually separated from the sidewalls by etch stopping layer 108). For example, an etch chemistry of HBr or a chlorine-based etch may be used. Preferably, sidewall spacers 114 are formed in both the NMOS 120 and PMOS 122 regions at this point. Alternatively, sidewall spacers 114 may be formed in only one of the regions as described below.

Figure 1D:
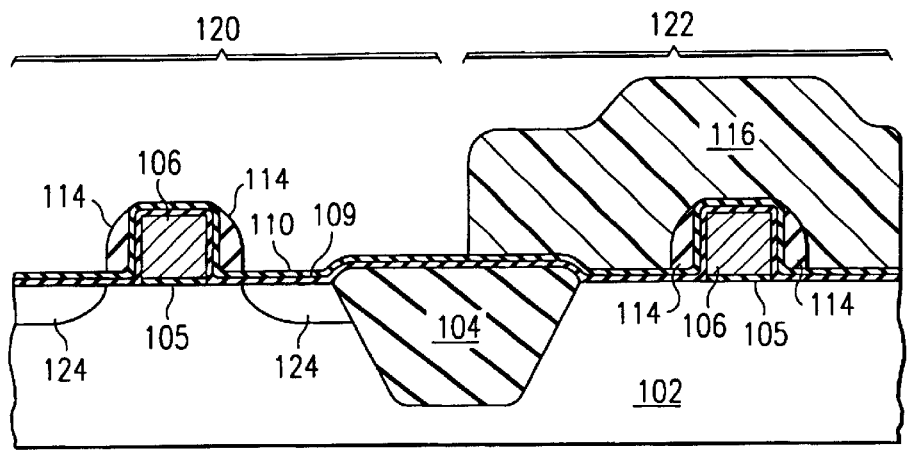

Referring to FIG. 1D, the NMOS resist mask 116 is formed to expose the regions where n-type transistors are desired (NMOS regions 120) and cover the regions where p-type transistors are desired (PMOS regions 122). NMOS resist mask 116 is thick enough to block the subsequent dopant implants. For example, a typical thickness is on the order of 1 micron. Alternatively, the p-type implants may be performed first and thus the PMOS resist mask and implant processes described below would be formed first.

Figure 2:
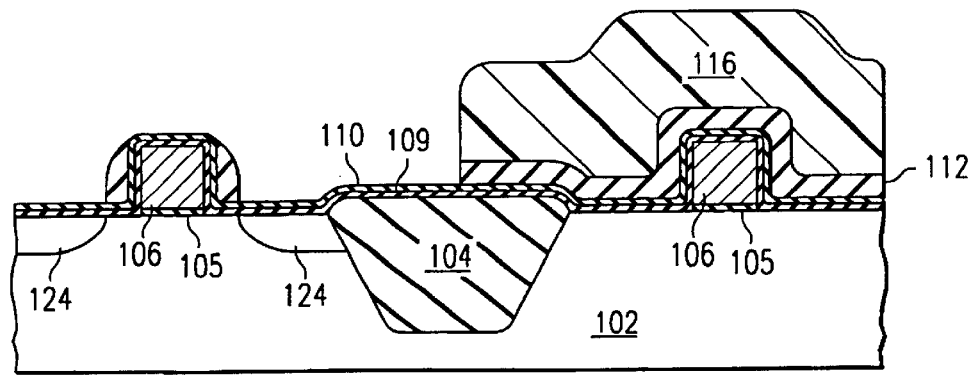
FIG. 2. is a cross-sectional diagram of CMOS transistors according to an alternative embodiment of the invention.

The anisotropic etch described above to form disposable spacers 114 may alternatively be performed after forming NMOS resist mask 116. In this case, disposable spacers 114 are only formed in the NMOS regions 120 as shown in FIG. 2. Portions of SiGe layer 112 remain under NMOS resist mask 116. The remaining discussion assumes that disposable spacers 114 are formed in both the NMOS and PMOS regions.

With disposable spacers 114 in place, the source/drain implant is performed for the NMOS region 120. For shallow implants in scaled CMOS, the nitride can be omitted to minimize the etch-stop thickness. Thus, source/drain regions 124 are formed. Appropriate source/drain implants are known in the art. For example, an implant of arsenic (As) at 40–80 keV may be used. In addition, a phosphorus (P) grading implant at 20–40 keV may be used.

Figure 1E:
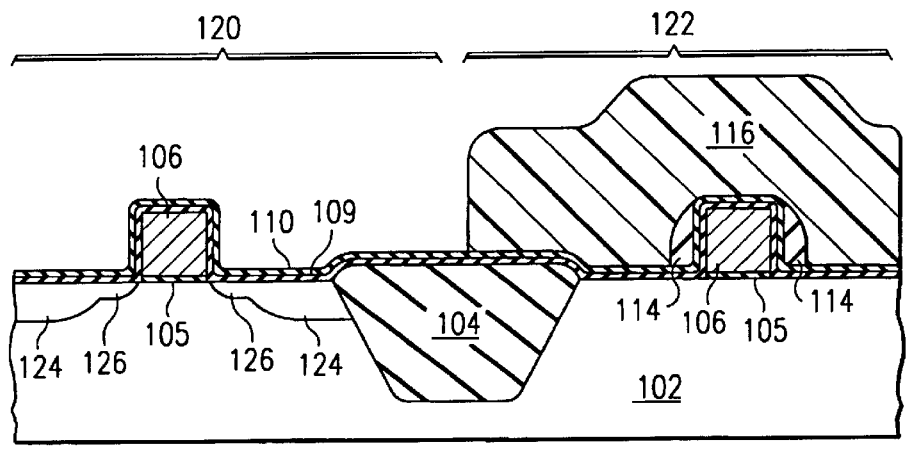

Referring to FIG. 1E, disposable spacers 114 in NMOS region 120 are removed. For example, an isotropic dry etch using SF6 and O2 may be used. This etch chemistry stops on the etch stopping layer 108. Then, the MDD implant is performed to form drain extension regions 126. Appropriate MDD implants are known in the art. For example, an As implant in the range of 5–20 keV may be used.

The NMOS resist mask may remain in place for the MDD implant. Alternatively, however, the NMOS resist mask may be removed prior to the MDD implant if portions of SiGe layer 112 remain in the PMOS regions 122 (as shown in FIG. 2) and an oxide cap is used under the NMOS resist mask. In this case, the NMOS resist mask could be stripped following the source/drain implant. Then the disposable spacers in the NMOS regions 120 could be removed using a wet isotropic etch with NH4OH:H2O2:H2O mixtures as well as HNO3:H2O2:H2O or H3PO4:H2O2:H2O mixtures. The cap oxide and remaining portions of SiGe layer 112 would then serve as the mask for the MDD implant.

If it has not already been removed, NMOS resist mask is now removed. If a separate anneal is desired for the NMOS regions, an anneal can be performed at this time. Alternatively, the NMOS and PMOS anneals can be combined later in the process.

Figure 1F:
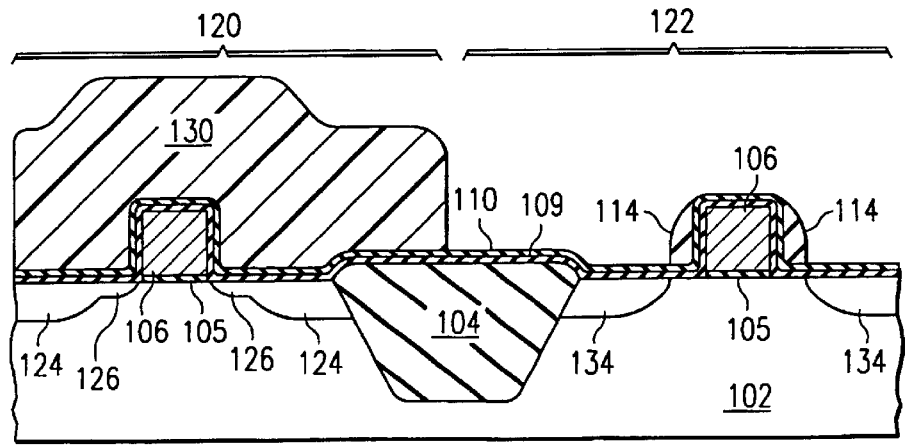

The process is then repeated for the PMOS regions. Referring to FIG. 1F, the PMOS resist mask 130 is formed to expose the regions where p-type transistors are desired (PMOS regions 122) and cover the regions where n-type transistors are desired (NMOS regions 120). PMOS resist mask 130 may have a thickness on the order of that used for the NMOS resist mask. If disposable spacers 114 have not previously been formed in PMOS region 122, an anisotropic etch using a HBr:Cl2 or Cl2 chemistry is used to form them.

With disposable spacers 114 in place, the source/drain implant is performed for the PMOS region 122. Thus, source/drain regions 134 are formed. Appropriate source/drain implants are known in the art. For example, an implant of B11 at 5–10 keV or BF2 at 5–30 keV may be used.

Figure 1G:
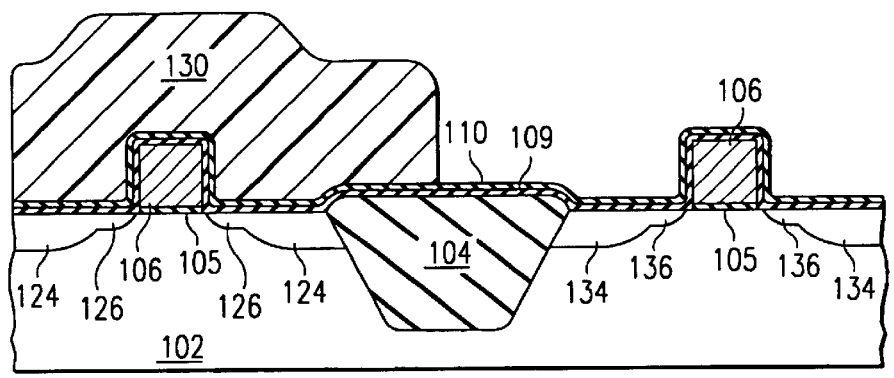

Referring to FIG. 1G, disposable spacers 114 in PMOS region 122 are removed. For example, an isotropic dry etch using SF6 and O2 may be used. This etch chemistry stops on the etch stopping layer 108. Then, the MDD implant is performed to form drain extension regions 136. Appropriate MDD implants are known in the art. For example, a BF2 (or its derivative) implant in the range of 2–15 keV may be used.

Figure 1H:
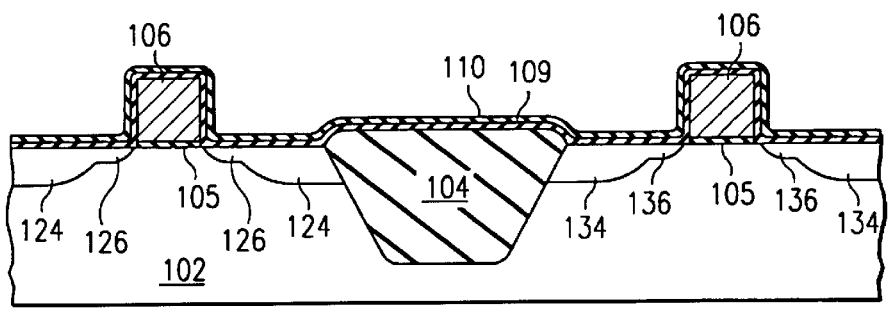

PMOS resist mask 130 is then stripped and an anneal is performed, as shown in FIG. 1H. If an anneal was performed earlier in the process for the NMOS regions 120, the two anneals may be optimized between the n and p regions.

Figure 1I:
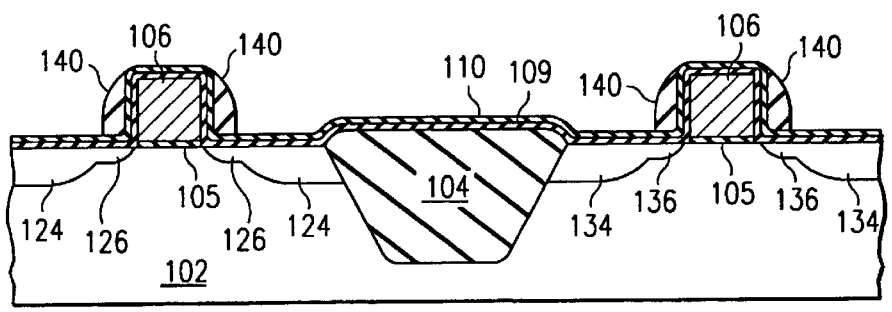

At this point, conventional oxide or nitride spacers 140 could be formed, as shown in FIG. 1I. For example, deposition using a low thermal budget process such as RTCVD or HDP may be used to minimize dopant diffusion. This may be followed by spacer etch and salicidation. Alternatively, the formation of final spacers could be avoided if the nitride layer 110 is etched at the same time as the SiGe disposable spacer definition. the underlying oxide layer 109 could still protect the underlying silicon during the etch processes. An HF deglaze prior to suicide metal deposition would then clear the silicon surface over the source/drain regions but leave the oxide/nitride stack on the gate electrode edges and over the drain extension regions to prevent silicidation over the MDD/LDD extensions.

The above process utilizes only two mask levels for source/drain and MDD/LDD implants instead of four as in the conventional CMOS process. Reducing two mask levels results in considerable cost savings over the life of a product.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

What is claimed is:

1. A method for fabricating an integrated circuit, comprising the steps of:
    forming a plurality of gate electrodes over a semiconductor body;
    forming an etch stopping layer over said gate electrodes and said semiconductor body;
    forming a layer comprising germanium over said etch stopping layer;
    forming a first mask layer over said semiconductor body exposing a first region of said semiconductor body and covering a second region of said semiconductor body;
    anisotropically etching a portion of said of said layer comprising germanium exposed by said first mask layer to form first disposable spacers separated from edges of said gate electrodes by said etch stopping layer;
    implanting first source/drain regions in said first region using said first mask layer and said first disposable spacers as an implant mask;
    removing said first disposable spacers;
    implanting first drain extension regions in said semiconductor body using said first mask layer as an implant mask after removing said first disposable spacers; and
    removing said first mask layer.

2. The method of claim 1, further comprising the steps of:
    forming a second mask layer over said semiconductor body exposing said second region of said semiconductor body and covering said first region of said semiconductor body;
    anisotropically etching a portion of said layer comprising germanium exposed by said second mask layer to form second disposable spacers separated from edges of said gate electrodes by said etch stopping layer;
    implanting second source/drain regions in said second region using said second mask layer and the second disposable spacers as an implant mask;
    removing the second disposable spacers;
    implanting second drain extension regions in said semiconductor body using said second mask layer as an implant mask after removing said second disposable spacers; and
    removing said second mask layer.

3. The method of claim 1, wherein said etch stopping layer comprises oxide.

4. The method of claim 1, wherein said etch stopping layer comprises nitride.

5. The method of claim 1, wherein said etch stopping layer comprises a layer of oxide and a layer of nitride.

6. The method of claim 1, wherein said disposable spacers comprise silicon germanium.

* * * * *